US006933221B1

(12) United States Patent
Jiang

(10) Patent No.: US 6,933,221 B1
(45) Date of Patent: Aug. 23, 2005

(54) METHOD FOR UNDERFILLING SEMICONDUCTOR COMPONENTS USING NO FLOW UNDERFILL

(75) Inventor: Tongbi Jiang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 39 days.

(21) Appl. No.: 10/178,703

(22) Filed: Jun. 24, 2002

(51) Int. Cl.[7] .............................................. H01L 21/44
(52) U.S. Cl. ...................... 438/613; 438/660
(58) Field of Search ............... 438/612–615, 438/660, 661, 663

(56) References Cited

U.S. PATENT DOCUMENTS

| | | | |
|---|---|---|---|
| 5,128,746 A | 7/1992 | Pennisi et al. | |
| 6,063,647 A | 5/2000 | Chen et al. | |
| 6,168,972 B1 | 1/2001 | Wang et al. | |
| 6,260,264 B1 | 7/2001 | Chen et al. | |
| 6,356,333 B1 * | 3/2002 | Uchiyama | 349/149 |
| 2002/0127406 A1 * | 9/2002 | Sachdev et al. | 428/413 |

FOREIGN PATENT DOCUMENTS

JP          2002-170847    *  6/2002   ........... H01L 21/60

OTHER PUBLICATIONS

Dexter Electronic Materials, Hysol FP 4451 Material Properties, technical information, Aug. 20, 1999, pp. 1–2, ibid FP 4450.

* cited by examiner

Primary Examiner—Douglas Wille
Assistant Examiner—Ginette Peralta
(74) Attorney, Agent, or Firm—Stephen A. Gratton

(57) ABSTRACT

An underfill material for attaching and underfilling a semiconductor component on a substrate includes a polymer base material, and electrically conductive particles in the polymer base material. The particles are configured to melt and rigidify bonded electrical connections between solder terminal contacts on the component and substrate contacts on the substrate. A size and concentration of the particles is selected to prevent electrical conductivity in X and Y directions. A method for attaching and underfilling the component on the substrate includes the steps of depositing the underfill material on the substrate or the component, placing the terminal contacts in contact with the substrate contacts while the underfill material is in a viscous or B-stage condition, bonding the terminal contacts to the substrate contacts to form the connections, and then curing the underfill material to form an underfill layer. During the bonding step at least some of the conductive particles melt and form solder layers on the substrate contacts.

35 Claims, 5 Drawing Sheets

METHOD FOR UNDERFILLING SEMICONDUCTOR COMPONENTS USING NO FLOW UNDERFILL

FIELD OF THE INVENTION

This invention relates generally to semiconductor packaging, and more particularly to a no flow underfill material for underfilling semiconductor components. This invention also relates to a method for underfilling semiconductor components using the underfill material, and to electronic systems constructed using the underfill material.

BACKGROUND OF THE INVENTION

Semiconductor components, such as packages, dice and wafers include terminal contacts which provide input/output paths to the integrated circuits contained on the components. For surface mount components, the terminal contacts can comprise solder or gold bumps or balls, bonded to contact pads on the component. For some components, such as chip scale packages, BGA packages, and flip chip devices, the terminal contacts can be arranged in a dense grid array, such as a ball grid array (BGA), or a fine ball grid array (FBGA).

One method for attaching components having this type of terminal contacts into various electronic systems is known as flip chip bonding. With flip chip bonding the terminal contacts on the component are bonded to corresponding substrate contacts on a supporting substrate, such as a module substrate or a printed circuit board (PCB). A typical bonding process involves ref lowing terminal contacts made of solder or gold to form metallurgical bonds with the substrate contacts.

One aspect of flip chip mounted components is that thermal stresses can develop at the connections (e.g., solder joints) between the terminal contacts and the substrate contacts. These thermal stresses develop because the components are formed of a first type of material (e.g., silicon), the terminal contacts are formed of a second type of material (e.g., solder or gold), and the substrate is formed of a third type of material (e.g., ceramic or bismaleimide triazine). The different materials have different thermal coefficients of expansion (TCE), such that variations in temperature cause the materials to expand and contract by different amounts.

These thermal stresses can cause fatigue fractures to develop at the connections. The fatigue fractures can affect the reliability of the connections, and the physical bond between the component and the substrate. In addition, fatigue fractures can cause some of the connections to fail entirely. For example, failures from fatigue fractures often occur at the outside corners of a grid array where the stresses are most concentrated.

One method for alleviating the adverse affects of thermal stresses is to encapsulate the terminal contacts in a low stress underfill encapsulant. Typically, the underfill encapsulant also completely fills the space between the component and the substrate. The underfill encapsulant functions to redistribute the thermal stresses over a surface area that is about the same size as the component. In addition, the TCE of the underfill encapsulant can be closely matched to the TCE of the terminal contacts, such that thermal stresses at their connections with the substrate contacts are reduced. The underfill encapsulant also physically bonds the component to the substrate, and protects the terminal contacts from contaminants, such as moisture and dust.

Two different processes have been developed in the art for encapsulating components in an underfill encapsulant. A capillary underfill process is shown in FIG. 1A. A no flow underfill process is shown in FIG. 1B. Either of these processes can be performed at the wafer level on wafer sized components (e.g., semiconductor wafers), or at the die level on die sized components (e.g., semiconductor packages).

Referring to FIG. 1A, the capillary underfill process includes four steps (Steps A–D). Initially, a component 10 and a supporting substrate 12 are provided. The component 10 includes terminal contacts 14, and the supporting substrate 12 includes substrate contacts 16, substantially as previously described. Step A is an alignment step, in which the terminal contacts 14 are aligned with the substrate contacts 16. Step B is a bonding step, such as a solder reflow, in which the terminal contacts 14 are bonded to the substrate contacts 16. Step C is a capillary injection step, in which a dispensing apparatus 18 dispenses viscous underfill material 20 which is drawn by capillary action between the component 10 and the substrate 12. Step D is a curing step, in which the underfill material 20 is cured to formed an underfill layer 22 which encapsulates the terminal contacts 14 and bonds the component 10 to the substrate 12.

As with most processes, the capillary underfill process has certain limitations. For example, voids can form in the underfill layer 22 if the capillary injection step is not performed properly. In addition, the underfill material 20 must have a relatively low viscosity, such that the curing step takes a relatively long time to perform.

Referring to FIG. 1B, the no flow underfill process also includes four steps (Steps 1–4). Initially, in Step 1 the substrate 12 and the substrate contacts 16 are provided. Step 2 is a no flow dispensing step, in which a no flow underfill material 20NF is deposited by a dispensing apparatus 18NF onto the substrate contacts 16 and onto the surface of the substrate 12. The no flow underfill material 20NF has a relatively high viscosity, such that it remains on the area of the substrate 12 on which it is initially deposited. Step 3 is a placement step, in which the terminal contacts 14 on the component 10 are pressed through the no flow underfill material 20NF into contact with the substrate contacts 16. Step 4 is a bonding and curing step, in which the terminal contacts 14 are bonded to the substrate contacts 16, and the no flow underfill material 20NF is cured to form a no flow underfill layer 22NF. Because bonding between the terminal contacts 14 and the substrate contacts 16 typically occurs by solder reflow, the no flow underfill material 20NF is also sometimes referred to as a "reflow" encapsulant.

The no flow underfill process also has certain limitations. For example, the height of the terminal contacts 14 can vary, such that some of the terminal contacts 14 may not physically touch the substrate contacts 16 during the placement step. These terminal contacts 14 may not bond properly to the substrate contacts 16 affecting the physical and electrical connections therebetween. Similarly, the surface of the substrate 12 may be non planar causing the same bonding problem. Also, the no flow underfill material 20NF is difficult to formulate with the required physical properties. For example, polymers with no flow characteristics may not have a good TCE match with the terminal contacts 14, and may have low modulus of elasticity characteristics. Because of these characteristics, no flow underfill layers 20NF fail earlier in temperature cycling tests than capillary underfill layers.

Referring to FIG. 1C, another problem associated with no flow underfill processes is illustrated. In this example the terminal contacts 14 comprise a solder material, such as a SnPb solder, that has been reflow bonded to the substrate contacts 16. In addition, the no flow underfill layer 22NF includes a filler which includes non conductive particles 27. For example, the non-conductive particles 27 can comprise silicates configured to reduce the TCE, and to adjust the viscosity of the underfill layer 22NF. As shown in FIG. 1C, some of the non-conductive particles 27 can be trapped at the interface of the terminal contacts 14 with the substrate contacts 16. These trapped non-conductive particles 27 can add resistance to the electrical connections between the terminal contacts 14 and the substrate contacts 16. In addition, these trapped non-conductive particles 27 can adversely affect the physical bond between the terminal contacts 14 and the substrate contacts 16.

Referring to FIG. 1D, another problem associated with no flow underfill processes is illustrated. In this example the terminal contacts 14 are made of gold, and have again been bonded to the substrate contacts 16. In addition, the no flow underfill layer 22NF includes Ni particles 29. As before, some of the Ni particles 29 can be trapped at the interface of the terminal contacts 14 with the substrate contacts 16. These Ni particles 29 have a different resistivity than the gold terminal contacts 14, such that the resistance of the electrical connections between the terminal contacts 14 and the substrate contacts 16 can vary, and change abruptly across the terminal contacts 14. In addition, the Ni particles 29 can adversely affect the physical bond between the terminal contacts 14 and the substrate contacts 16.

The present invention provides a no flow underfill material, and a method of underfilling, that overcome some of the limitations of conventional underfill processes.

SUMMARY OF THE INVENTION

In accordance with the present invention, a no flow underfill material, a method for underfilling semiconductor components on supporting substrates using the underfill material, and an electronic system incorporating the underfill material, are provided.

The underfill material is formulated to cure, or polymerize, into an underfill layer for encapsulating electrical connections between solder terminal contacts on the semiconductor component, and substrate contacts on the substrate. The underfill material includes an electrically insulating polymer base material, such as an epoxy resin, a silicone resin, or a polyimde resin. The polymer base material is formulated to have a viscosity that provides no flow characteristics over a first temperature range. In addition to the polymer base material, the underfill material includes a curing agent or hardener, such as a reactant or a solvent, that reacts with and cures the polymer base material. In addition, the underfill material includes a fluxing agent, such as an acid, that removes surface oxides from the substrate contacts.

The underfill material also includes electrically conductive micro particles embedded in the polymer base material. The micro particles can comprise a solder alloy (e.g., eutectic SnPb), or another conductive material (e.g., Sn), configured to melt at a second temperature range, and to alloy with the solder terminal contacts to form reinforcing solder layers on the electrical connections. In addition, the concentration of the micro particles in the polymer base material is selected such that there is no electrical conductivity through the cured underfill layer in the X and Y directions.

The method includes the steps of providing the component with the terminal contacts, and providing the supporting substrate with the substrate contacts. The method also includes the step of providing the underfill material with the electrically conductive micro particles embedded in the polymer base material. In addition, the method includes the steps of depositing the underfill material on the substrate (or alternately on the component), placing the terminal contacts in contact with the substrate contacts while the underfill material is in a viscous condition, bonding the terminal contacts to the substrate contacts to form the electrical connections, and then curing the underfill material to form the underfill layer.

The bonding and curing steps can be initiated at the same time at the second temperature range using a standard reflow furnace. Preferably, the electrical connections are formed before the underfill layer is completely cured. During the bonding and curing steps, at least some of the micro particles can alloy with the terminal contacts and form solder layers bonded to the substrate contacts.

The method can be performed at the wafer level on a wafer sized component (e.g., a semiconductor wafer) or at the die level on a die sized component (e.g., a semiconductor die or a semiconductor package). A wafer level method can also include a singulating step in which the wafer sized component is separated into die sized components. In addition, some of the steps can be performed at the wafer level, while other steps are performed at the die level. For example, the underfill material can be deposited on a wafer containing a plurality of dice or packages. Next, a singulating step can be performed to singulate the wafer into dice or packages. The individual dice or packages can then be attached to the substrate while the underfill layer remains in a viscous condition, or is placed in a B-stage condition.

The electronic system includes at least one component on a substrate, and a plurality of electrical connections between the terminal contacts on the component and substrate contacts on the substrate. The system also includes an underfill layer attaching the component to the substrate and encapsulating the electrical connections. In addition, the underfill layer includes a plurality of conductive particles, at least some of which form solder layers bonded to the substrate contacts.

DETAILED DESCRIPTION OF THE PREFERRED EMBODIMENTS

As used herein, the term "semiconductor component" refers to an electronic element that includes a semiconductor die. Exemplary semiconductor components include semiconductor packages, semiconductor dice, BGA devices, flip chip devices and semiconductor wafers.

Referring to FIGS. 2A–2E, and FIGS. 3A–3F, a method for underfilling a semiconductor component 28 (FIG. 2C) on a supporting substrate 32, using a no flow underfill material 30 (FIG. 2B) formulated in accordance with the invention is illustrated. In addition to underfilling the component 28, the method encapsulates and attaches the component 28 to the substrate 32.

Figure 1A:
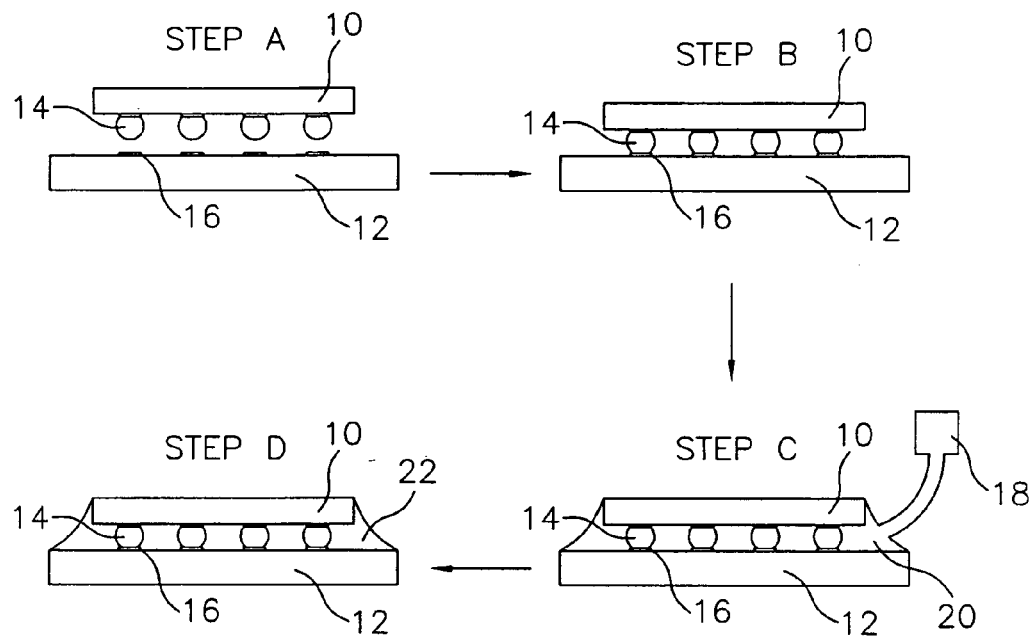
FIG. 1A is a schematic view illustrating steps in a prior art capillary underfill process.
Figure 1B:
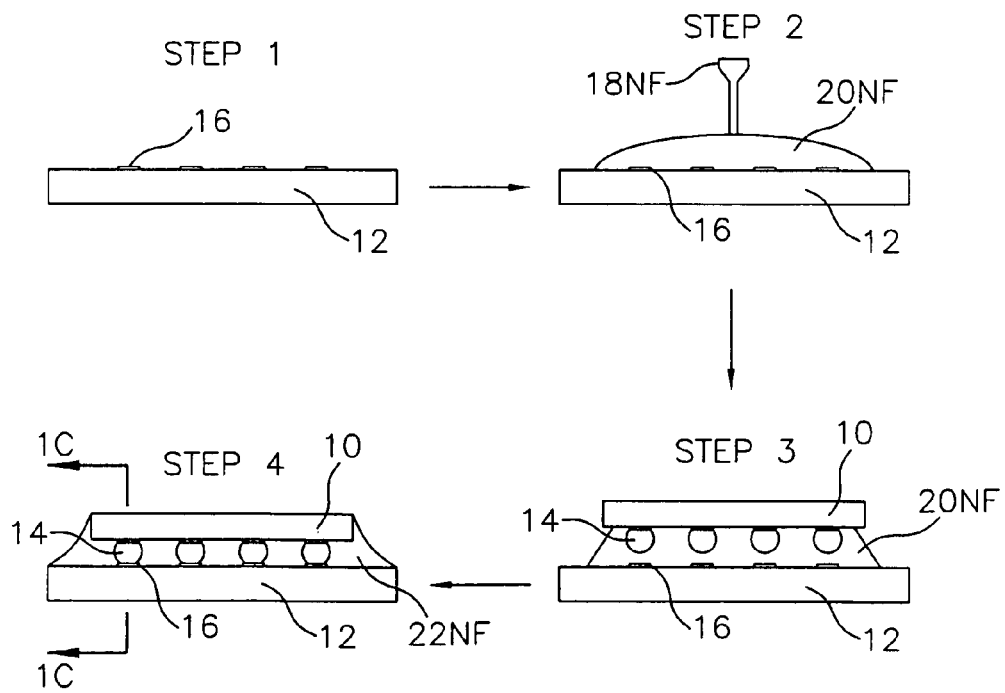
FIG. 1B is a schematic view illustrating steps in a prior art no flow underfill process.
Figure 1C:
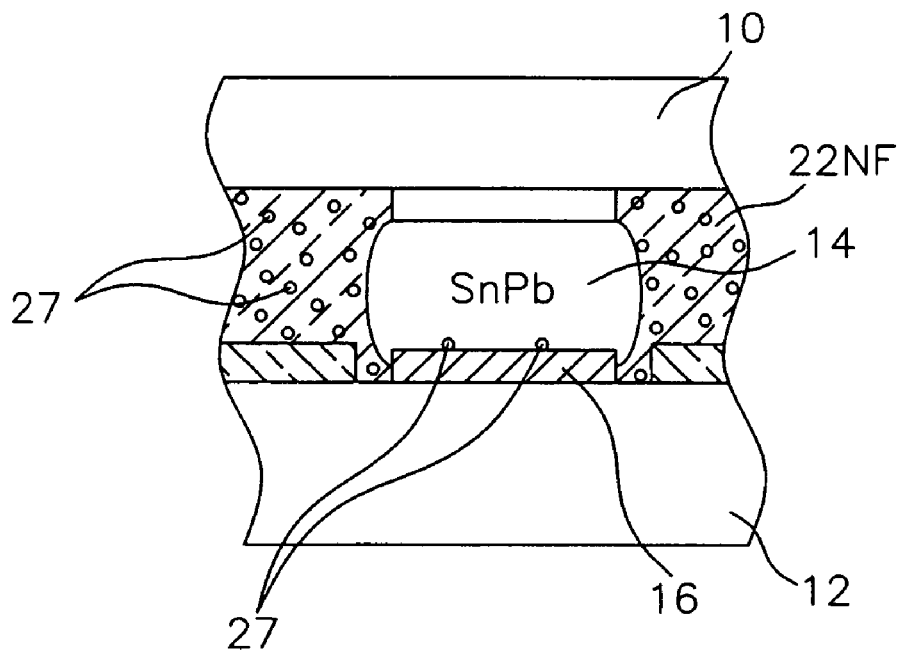
FIG. 1C is an enlarged cross sectional view taken along section line 1C—1C of FIG. 1B illustrating non conductive particles in a no flow underfill layer.
Figure 1D:
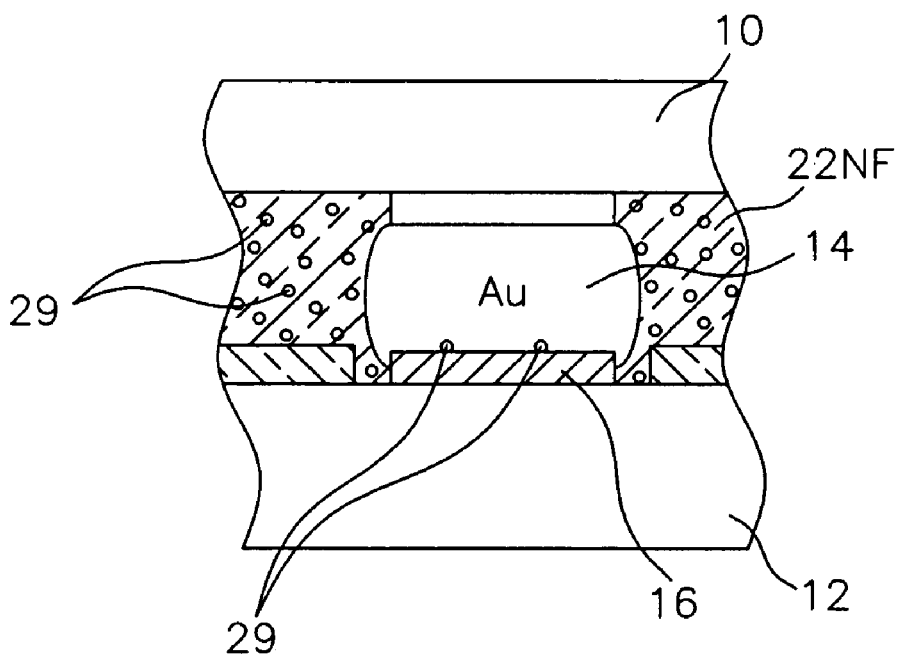
FIG. 1D is an enlarged cross sectional view equivalent to FIG. 1C illustrating nickel particles in a no flow underfill layer.
Figure 2A:
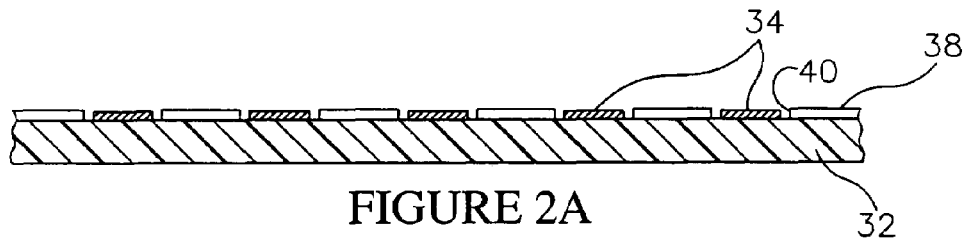
FIGS. 2A–2E are schematic cross sectional views illustrating steps in the method for underfilling semiconductor components in accordance with the invention.

Referring to FIG. 2A, the substrate 32 can comprise a module substrate, a circuit board, a package substrate, or any other element for mounting one or more semiconductor components 28 in a desired electrical configuration. In addition, the substrate 32 can comprise an electrically insulating material, such as ceramic, or plastic (e.g., bismaleimide triazine (BT), polyimide resin), or a semiconductor material, such as silicon. Further, the substrate 32 can have a selected peripheral size, shape and thickness and can be configured to mount one or more components 28.

The substrate 32 includes a plurality of substrate contacts 34, which in the illustrative embodiment comprise planar pads. The substrate contacts 34 are arranged in a pattern that matches a pattern of terminal contacts 36 (FIG. 2C) on the semiconductor component 28 (FIG. 2C). For example, the substrate contacts 34 and the terminal contacts 36 can be arranged in a dense grid array, such as a micro grid array. Also in the illustrative embodiment, the terminal contacts 36 comprise a solder alloy, and the substrate contacts 34 comprise a solder wettable metal.

Suitable solder alloys for the terminal contacts 36 include eutectic PbSn solder alloys, such as 95% Pb/5% Sn, 60% Pb/40% Sn, 63% Sn/37% Pb and 62% Pb/36% Sn/2% Ag. In general, these eutectic solder alloys melt at a temperature of between about 150° C. to 250° C. As another alternative, the terminal contacts 36 can comprise a Pb free solder alloy, such as a SnAgCu solder.

Suitable metals for the substrate contacts 34 include copper, tin, lead, palladium, platinum, nickel, chrome, titanium, gold, zinc and alloys of these metals. As will be further explained, the method of the invention forms electrical connections 46 (FIG. 2E) which physically and electrically connect the component 28 to the substrate 32. In addition, the method of the invention forms solder layers 52 (FIG. 3E) between the terminal contacts 36 and the substrate contacts 34 which reinforce the electrical connections 46.

A peripheral outline and size of the substrate contacts 34 can be selected as required (e.g., circular, square, polygonal). The substrate contacts 34 are in electrical communication with conductors (not shown), and various other electronic elements (not shown) on the substrate 32. Further, the substrate 32 can include multiple patterns of substrate contacts 34, such that multiple components 28 (FIG. 2B) can be attached to the substrate 32. For example, for a wafer sized component (e.g., semiconductor wafer), the substrate 32 can include enough patterns of substrate contacts 34 to electrically engage all of the dice on the component.

The substrate 32 can also include a mask 38, such as a solder mask, having openings 40 aligned with the substrate contacts 34. The mask 38 can comprise an electrically insulating material, such as a photoimageable resist, configured to provide electrical insulation, and to prevent electrical shorting.

Figure 2B:
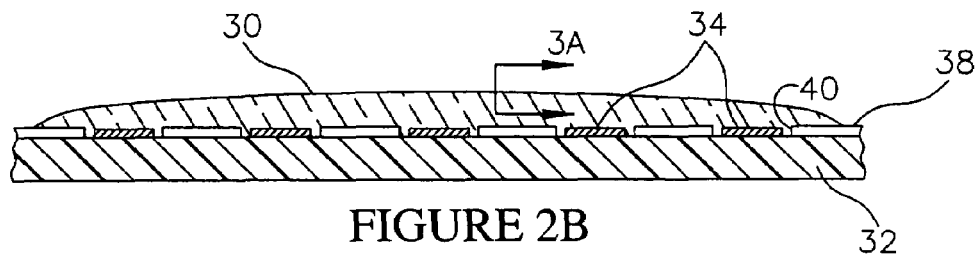
Figure 2C:
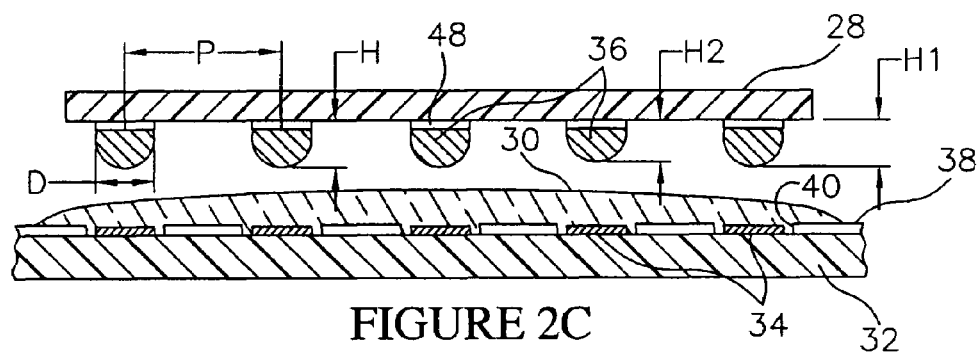

Initially, as shown in FIG. 2B, the underfill material 30 is deposited on a selected area of the substrate 32, and covers the substrate contacts 34 in this area. The underfill material 30 has a peripheral outline that is about the same as the peripheral outline of the component 28. In addition, a thickness T of the underfill material 30 is about the same as a height H1 (FIG. 2C) of the terminal contacts.

The underfill material 30 can be deposited using a suitable deposition process, such as positive displacement through a nozzle, screen printing, stenciling or pin transfer. Systems are commercially available for performing each of these processes in the context of semiconductor packaging. For example, material dispensing systems are manufactured by Asymtek of Carlsbad, Calif., and by Camalot of Cookson, UK.

The underfill material 30 is formulated to meet environmental standards recognized in the semiconductor industry. In addition, the underfill material 30 is formulated with a viscosity that provides non-flowing characteristics over a selected temperature range, such as a room temperature range (e.g., 22° C. to 37.8° C.) or an elevated temperature range (e.g., 22° C. to 100° C.). This viscosity allows the underfill material 30 to maintain a desired size and shape, and to remain on the selected area of the substrate 32 over the selected temperature range. By way of example, the underfill material 30 can have a viscosity at a temperature between 22° C. to 100° C., of about 7000 to 200,000 cps (centipoise). In this case, the viscosity can be measured using a Brookfield Viscosity with a spindle 51 rotated at about 5 rpm.

The underfill material 30 can also be formulated for deposition at a first viscosity followed by semi curing to a second viscosity. For example, the underfill material can initially be deposited with a first viscosity, and then partially cured to a second viscosity, such as a B-stage condition. As used herein, the term B-stage condition refers to a semi cured condition in which the underfill material is still viscous or pliable, but possesses a structural rigidity. The B-stage condition can occur at ambient temperature over a certain time period, or can be achieved by semi curing at a selected temperature and time period.

As a primary constituent, the underfill material 30 includes an electrically insulating polymer base material 44 (FIG. 3A) such as an epoxy resin, a silicone resin, a polyimide resin, or a similar elastomeric material having suitable non-flowing and curable properties. By way of example, specific polymer resins include, but are not limited to: pthalate-acetate hydroxyl copolymer, dibutyl isobutyl diphenol cellulose copolymer, and butyl phenol ketyl vinyl acetate polymer. One specific commercial polymer resin that can be used as the polymer base material 44 is manufactured by Dexter Electronic Materials of Rocky Hill, Conn. under the trademark "HYSOL" FF2000.

The underfill material 30 also includes a curing agent or hardener, such as a reactant or a solvent, that reacts with and cures the polymer base material 44 over the selected temperature range and during a selected time period. Suitable curing agents include amines, anhydrides, and butyl carbitol acetate. By way of example, the curing agent can be included in the polymer base material 44 in a quantity sufficient to cure the polymer base material 44 at temperatures and in time periods used during a solder reflow process for flip chip bonding semiconductor components to substrates. The curing step can be performed simultaneous with a bonding step using a reflow furnace to be hereinafter described. If required, a final cure can also be performed at a lower temperature for a longer time period.

The underfill material 30 also includes a fluxing agent configured to clean and remove oxides from the substrate contacts 34. Suitable fluxing agents include carboxylic acid, abietic acid, citric acid, 2-furoic acid, malic acid and polyacrylic acid.

Figure 2D:
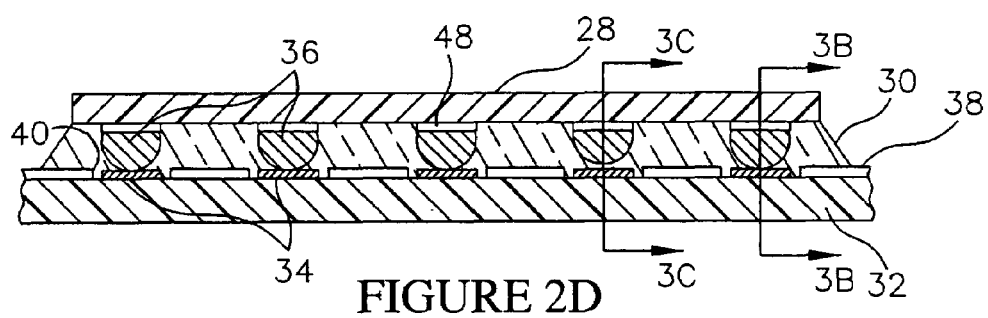
Figure 2E:
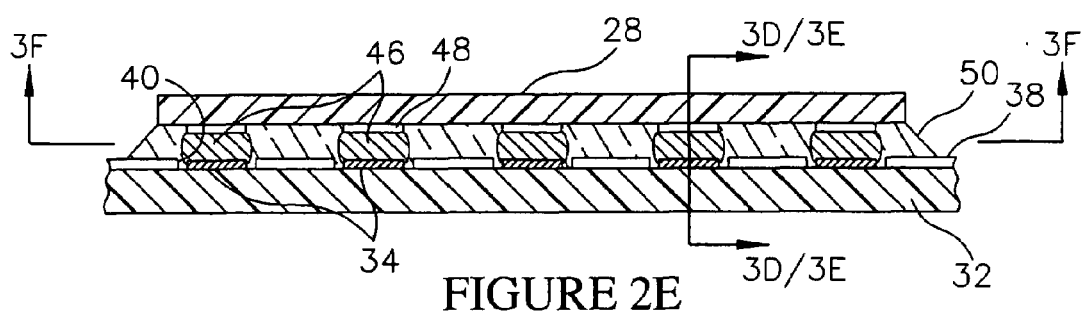
Figure 3A:
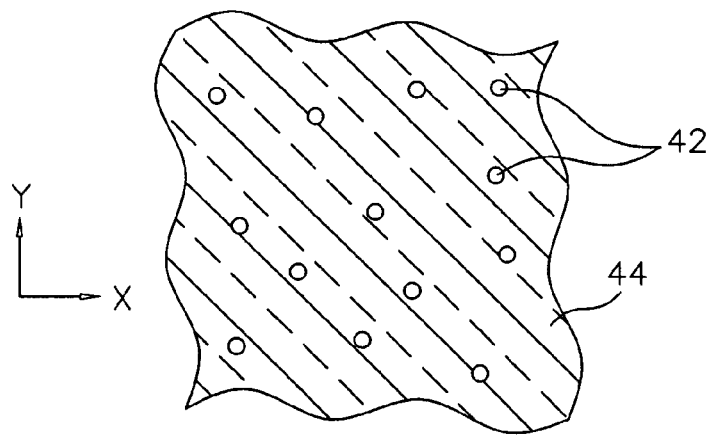
FIG. 3A is an enlarged cross sectional view taken along section line 3A—3A of FIG. 2B illustrating the no flow under fill material of the invention.

As shown in FIG. 3A, the underfill material 30 also includes a plurality of electrically conductive micro particles 42 embedded in the polymer base material 44. The micro particles 42 function as a filler which strengthens and increases the electrical conductivity of the electrical connections 46 (FIG. 2E). Preferably, the micro particles 42 comprise a metal that melts at the same temperature as the terminal contacts 36 (FIG. 2C) on the component 28. In addition, the micro particles 42 preferably comprise a metal that alloys with the terminal contacts 36 to form the solder layer 52 (FIG. 3E).

One suitable metal for the micro particles 42 is a solder alloy. For example the micro particles 42 can comprise the same solder alloy as the terminal contacts 36, such as the previously described PbSn, PbSnAg and SnAgCu solder alloys. The micro particles 42 can also comprise a different solder alloy than the terminal contacts, provided the melting temperatures are similar. As another alternative, the micro particles can comprise a metal, such as Sn, Pb, Ag, Au, Ge, Cu or In, that alloys easily with the solder alloy of the terminal contacts 36.

The micro particles 42 can have any shape, such as spherical, cigar, snow flake or dendritic. The outside diameter of the micro particles can be less than about 10 $\mu$m, and preferably less than about 5 $\mu$m. A representative size range can be from 1 $\mu$m to 10 $\mu$m. In addition, the micro particles 42 are present in the polymer base material 44 in a relatively low concentration, which prevents electrically conductivity in a first direction (X direction), and also in a second orthogonal direction (Y direction). As shown in FIG. 3A, the X and Y directions are located along planes that are generally parallel to the substrate contacts 34 (FIG. 2B) and generally perpendicular to a longitudinal axis of the terminal contacts 36.

The micro particles 42 preferably have a concentration in the underfill material 30, expressed as a volume percentage, of less than about 50% and more preferably less than about 30%. A representative range for the micro particles 42 can be from about 10% to 50%, where the percentages represent a volume percentage of the total volume of the underfill material 30.

Referring to FIG. 2C, an alignment step is performed in which the terminal contacts 36 on the component 28 are aligned with the substrate contacts 34 on the substrate 32. The alignment step can be accomplished using techniques that are known in the art, such as optical alignment using optical viewing devices, or mechanical alignment using fixtures and jigs.

The terminal contacts 36 are in electrical communication with the integrated circuits and other electronic devices contained on the component 28, and provide input/output connections for the component 28. In the illustrative embodiment, the terminal contacts 36 comprise solder bumps or balls that have been formed on pads 48 on the component 28 using techniques that are known in the art (e.g., reflow bonding, solder ball bumping). Further, the number, the diameter D, the height H, and the pitch P of the terminal contacts 36 can be selected as required. A representative diameter D and height H can be from about 0.005-in (0.127 mm) to about 0.016-in (0.400 mm) or larger. A representative pitch P can be from about 0.004-in (0.100 mm) to about 0.039-in (1.0) mm or more.

As shown in FIG. 2C, the terminal contacts 36 may not all have a uniform height. For example, the terminal contact 36 on the outer right edge of the component 28 may have a height H1 that is greater than a height H2 of an adjacent terminal contact 36 (H1>H2). As will be further explained, during formation of the electrical connections 46 (FIG. 2E), the underfill material 30 functions to alleviate the affects of this height differential.

Following the alignment step, a placement step is performed. As shown in FIG. 2D, during the placement step the terminal contacts 36 on the component 28 are pushed through the underfill material 30, such that the terminal contacts 36 physically touch the substrate contacts 34 on the substrate 32. The placement step, and the alignment step as well, can be performed using an automated system, such as one manufactured by Datacon of Austria under the trademark "2200 APM".

Figure 3B:
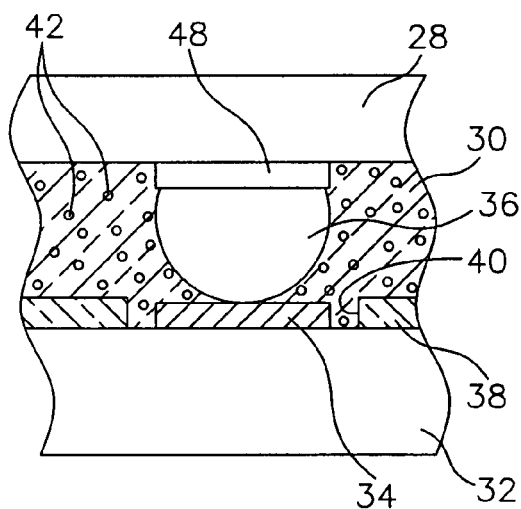
FIG. 3B is an enlarged cross sectional view taken along section line 3B—3B of FIG. 2D illustrating a terminal contact on a substrate contact during a placement step of the method.

As shown in FIG. 3B, the ideal situation is to have the terminal contacts 36 in metal to metal contact with the substrate contacts 34. However, even with metal to metal contact, some underfill material 30 is trapped between the terminal contacts 36 and the substrate contacts 34. This trapping phenomena occurs with the curved topography of the terminal contacts 36, and with adherence of the underfill material 30 to the terminal contacts 36.

Figure 3C:
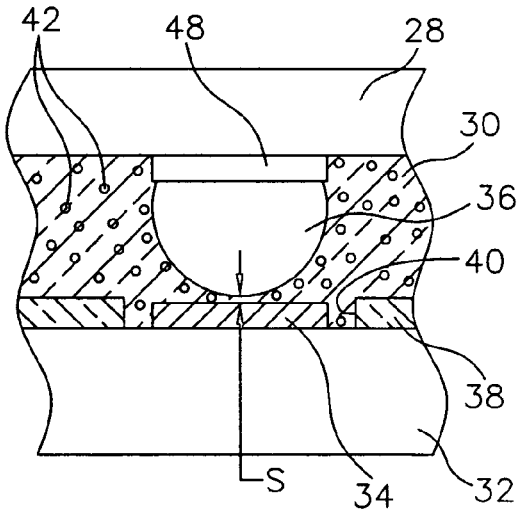
FIG. 3C is an enlarged cross sectional view taken along section line 3C—3C of FIG. 2D illustrating a terminal contact spaced from a substrate contact during the placement step of the method.

In addition, as shown in FIG. 3C, a terminal contact 36 can be spaced from its corresponding substrate contact 34 by a gap S. This gap S may be due to the previously described height differential between the terminal contacts 36, or may be due to the non-planarity of the substrate contacts 34. As also shown in FIG. 3C, underfill material 30 is present in the gap S due to the initial deposition of the underfill material 30 on the substrate contacts 34.

Following the placement step, and as shown in FIG. 2E, a bonding step which forms the electrical connections 46, and a curing step which forms a cured underfill layer 50 are performed. Although these steps are initiated at the same time, the curing step preferably continues for a time period that is longer than the bonding step.

To initiate the bonding step and the curing step, the component 28 and the substrate 32 are placed in a furnace, such as a commercial reflow furnace. The furnace is maintained at a temperature sufficient to reflow the solder material of the terminal contacts 36. The bonding step and the curing step can be performed using a staged process including a preheat stage (e.g., 120° C. to 150° C. for 1–5 minutes), a reflow stage (e.g., 150° C. to 250 C for 1–5 minutes), and if necessary a curing stage (e.g., 100° C. for 1–20 minutes).

Using a staged process, the electrical connections 46 are preferably formed during the reflow stage. Also during the reflow stage and the subsequent curing stage if performed, the underfill material 30 cures by outgassing or reaction of the curing agent.

Figure 3D:
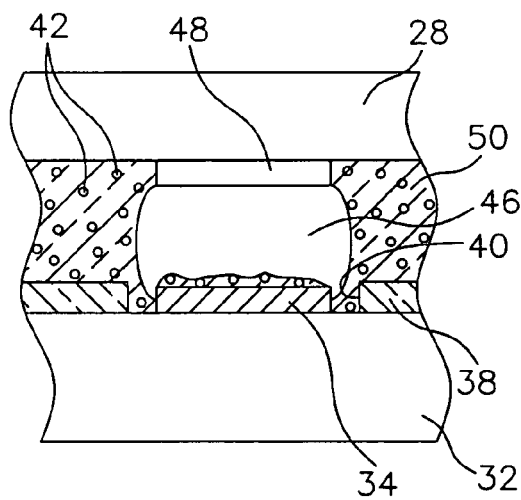
FIG. 3D is an enlarged cross sectional view taken along section line 3D—3D of FIG. 2E illustrating a terminal contact/electrical connection prior to completion of a bonding step.
Figure 3E:
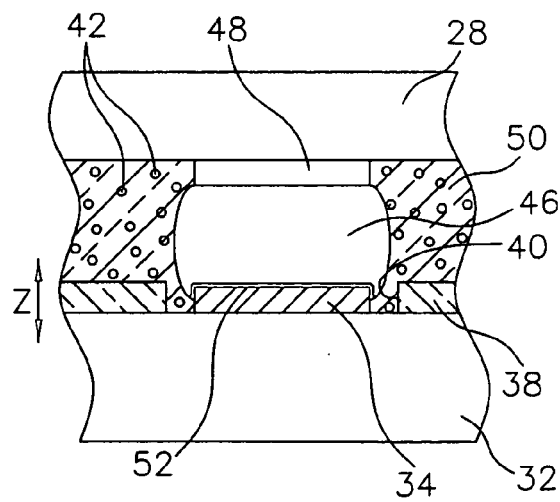
FIG. 3E is an enlarged cross sectional view taken along section line 3E—3E of FIG. 2E illustrating the electrical connection following the bonding step.

Referring to FIGS. 3D and 3E, the function of the micro particles 42 during the bonding step, and during formation of the electrical connections 46, is illustrated. FIG. 3D illustrates the terminal contacts 36 and electrical connections 46 at the start of the bonding step. FIG. 3E illustrates the electrical connections 46 at the completion of the bonding step.

As shown in FIG. 3D, some of the micro particles 42 are in contact with both the terminal contacts 36/electrical connections 45 and the substrate contacts 34. During the bonding step these micro particles 42 melt into the liquid phase, and alloy with the solder material that forms the terminal contacts 36. In addition, as shown in FIG. 3E, the melted micro particles 42 form solder layers 52 that rigidify the completed electrical connections 46, and the metallurgical bonds between the electrical connections 46 and the substrate contacts 34. Similarly, melted micro particles 42 can form in the underfill material 30 located in the spaces S (FIG. 3C) and form solder layers 52 in the spaces S.

In addition to rigidifying the electrical connections 46, the melted micro particles provide electrical conductivity in the Z direction (e.g., in a direction parallel to a longitudinal axis of the electrical connections 46). This improves the electrical path from the substrate contacts 34 to the electrical connections 46.

Figure 3F:
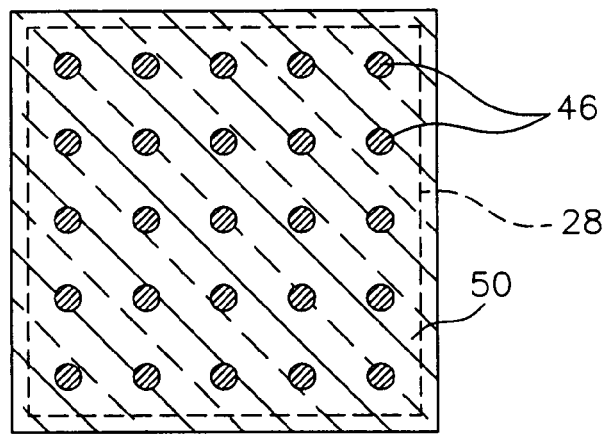
FIG. 3F is a cross sectional view taken along section line 3F—3F of FIG. 2E illustrating the cured underfill layer.

Further, as shown in FIG. 3F, the electrical connections 46 are encapsulated in the underfill layer 50. The underfill layer 50 thus rigidifies and seals the electrical connections 46. The underfill layer 50 also seals the space between component 28 and the substrate 32, and physically bonds the component 28 to the substrate 32.

Figure 4:
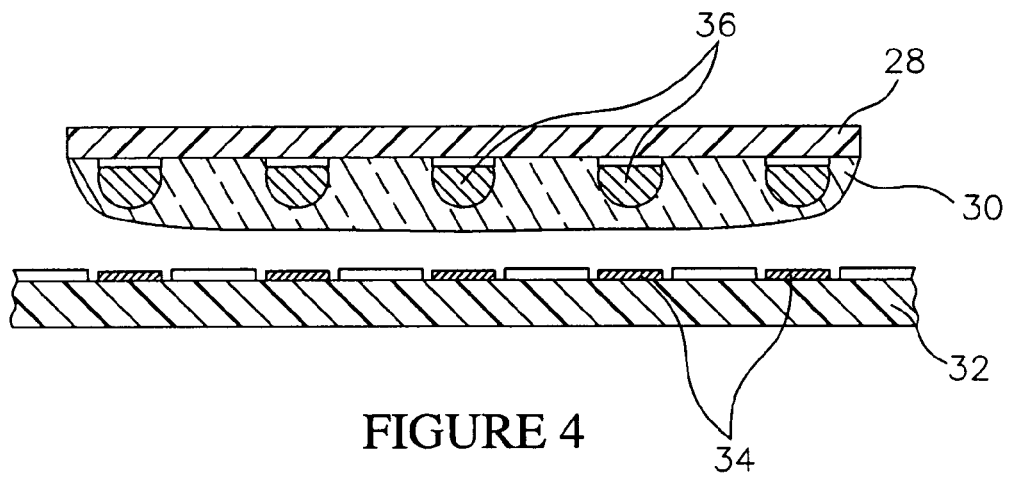
FIG. 4 is a schematic cross sectional view equivalent to FIG. 2C but illustrating an alternate embodiment of the method shown in FIGS. 2A–2E.

Referring to FIG. 4, an alternate embodiment of the method is illustrated. In the alternate embodiment, the underfill material 30 is initially deposited on the component 28 rather than on the substrate 32. As shown in FIG. 4, the underfill material 30 has a thickness that is greater that the height of the terminal contacts 36, such that the terminal contacts are encapsulated by the underfill material 30. Following this deposition step, an alignment step, a placement step, a bonding step and a curing step can be performed, substantially as previously described, to form the electrical connections 46 (FIG. 3E), the solder layers 52 (FIG. 3E) and the cured underfill layer 50 (FIG. 3E).

The alternate embodiment method can be performed initially at the wafer level, such as by depositing the underfill material 30 on a component 28 such as a wafer containing a plurality of components (e.g., dice or packages). The component 28 can then be singulated into a plurality of components and the alignment, placement, bonding and curing steps performed on the individual components, while the underfill material 30 is in a viscous or B-stage condition.

Figure 5A:
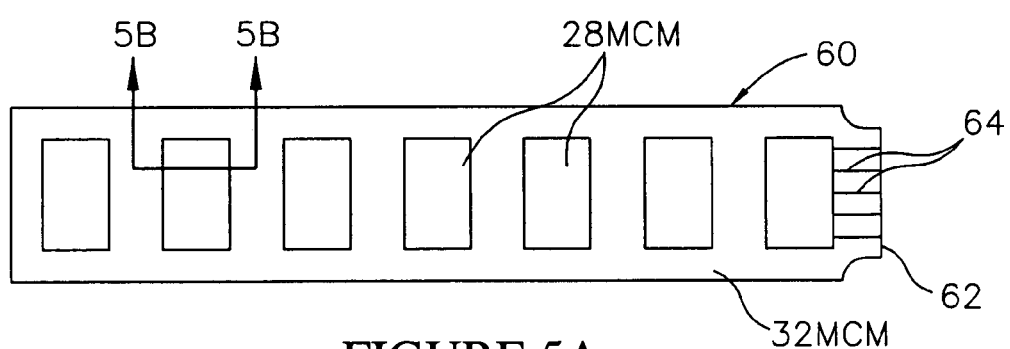
FIG. 5A is a plan view of a system constructed in accordance using the underfill material and method of the invention.
Figure 5B:
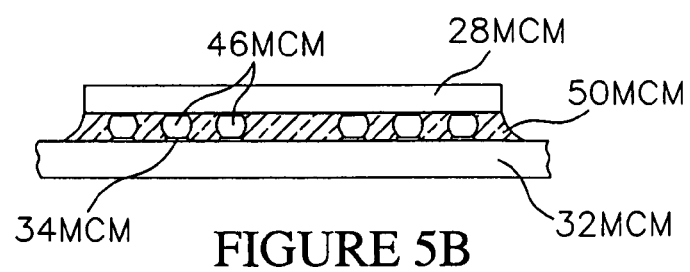
FIG. 5B is a cross sectional view taken along section line 5B—5B of FIG. 5A.

Referring to FIGS. 5A and 5B, a system 60 constructed using the underfill material 30, and the method of the invention is illustrated. The system 60 comprises a multi chip module configured to perform a desired electrical function (e.g., memory). The system 60 includes a module substrate 32MCM having an edge connector 62, and a plurality of conductors 64 in electrical communication with the edge connector 62. The system 60 also includes a plurality of components 28MCM, such as memory dice or packages, having electrical connections 46MCM formed on substrate contacts 34MCM substantially as previously described. The substrate contacts 34MCM are in electrical communication with the conductors 64 and the edge connector 62. The system 60 also includes an underfill layer 50MCM encapsulating the terminal contacts 36MCM, and attaching the components 28MCM to the substrate 32MCM.

Thus the invention provides an improved underfill material for encapsulating semiconductor components, a method for underfilling semiconductor components using the underfill material, and a system constructed using the underfill material and method. While the invention has been described with reference to certain preferred embodiments, as will be apparent to those skilled in the art, certain changes and modifications can be made without departing from the scope of the invention as defined by the following claims.

What is claimed is:

1. A method for underfilling a semiconductor component on a substrate having a plurality of substrate contacts comprising:
   providing a plurality of terminal contacts on the component comprising a solder alloy configured to melt at a temperature between about 150° C. to 250° C.;
   providing an underfill material comprising a polymer base material and a plurality of electrically conductive particles in the base material comprising a metal configured to melt and alloy with the solder alloy at the temperature;
   depositing the underfill material on a selected area of the substrate or the component;
   placing at least some of the terminal contacts in contact with at least some of the substrate contacts; and
   forming a plurality of solder layers on the substrate contacts by heating the terminal contacts and the particles to the temperature to reflow the terminal contacts onto the substrate contacts and alloy at least some of the particles with the terminal contacts.

2. The method of claim 1 further comprising following the forming step, curing the underfill material.

3. The method of claim 1 wherein the particles comprise a metal selected from the group consisting of Ag, Au, Ge, Cu and In.

4. The method of claim 1 further comprising curing the underfill material during the forming step.

5. The method of claim 1 wherein the forming step is performed by reflowing the terminal contacts.

6. A method for underfilling a semiconductor component on a substrate having a plurality of substrate contacts comprising:
   providing a plurality of terminal contacts on the component comprising a solder alloy configured to melt at a temperature between about 150° C. to 250° C.;
   providing an underfill material comprising a polymer base material and a plurality of metal particles in the base material comprising the solder alloy;
   depositing the underfill material on the substrate or on the component;
   placing at least some of the terminal contacts in contact with at least some of the substrate contacts while the underfill material is in a viscous state; and
   heating the terminal contacts and the underfill material to the temperature to at least partially melt the terminal contacts and alloy at least some of the particles with the terminal contacts to form a plurality of solder layers on the substrate contacts comprising the solder alloy.

7. The method of claim 6 wherein the underfill material comprises a polymer base material and a curing agent configured to cure the polymer base material.

8. The method of claim 6 wherein the particles have a diameter of from 1 μm to 10 μm.

9. The method of claim 6 wherein the particles have a diameter of less than about 5 μm.

10. The method of claim 6 wherein the particles have a volume percentage of a total volume of the underfill material of from about 10% to 50%.

11. The method of claim 6 further comprising following the heating step, curing the underfill material.

12. The method of claim 6 wherein the solder alloy comprises a eutectic solder alloy.

13. The method of claim 6 wherein the solder alloy comprises a Pb free solder alloy.

14. The method of claim 6 wherein the underfill material has a viscosity during the depositing step of from 7,000 to 200,000 cps.

15. The method of claim 6 wherein the component comprises a semiconductor package, a semiconductor wafer or a semiconductor die.

16. A method for attaching a semiconductor component to a substrate having a plurality of substrate contacts comprising:
    providing a plurality of terminal contacts on the component configured to melt at a first temperature of from about 150° C. to 250° C.;
    providing an underfill material comprising a polymer base material having a no flow viscosity at a second temperature of from about 22° C. to 100° C., a plurality of metal particles in the polymer base material configured to melt and alloy with the terminal contacts at the first temperature, and a curing agent configured to cure the polymer base material;
    depositing the underfill material on the substrate or on the component;
    placing at least some of the terminal contacts and the substrate contacts in physical contact at the second temperature; and
    heating the terminal contacts and the substrate contacts to the first temperature to reflow the terminal contacts onto the substrate contacts and to melt and alloy at least some of the particles to at least some of the terminal contacts.

17. The method of claim 16 wherein the terminal contacts and the particles comprise a same solder alloy.

18. The method of claim 16 wherein the terminal contacts and the particles comprise a same eutectic solder alloy.

19. The method of claim 16 wherein the polymer base material comprises a material selected from the group consisting of epoxy, silicone and polyimide.

20. The method of claim 16 wherein the terminal contacts and the particles comprise a Pb free solder alloy.

21. The method of claim 16 wherein the particles comprise a metal selected from the group consisting of Sn, Pb, Ag, Au, Ge, Cu and In.

22. The method of claim 16 wherein the particles have a diameter of from 1 μm to 10 μm.

23. The method of claim 16 wherein the particles have a volume percentage of a total volume of the underfill material of from about 10% to 50%.

24. The method of claim 16 wherein the particles have a volume percentage of a total volume of the underfill material of less than about 50%.

25. The method of claim 16 wherein the particles have a volume percentage of a total volume of the underfill material of less than about 30%.

26. The method of claim 16 wherein the no flow viscosity is from 7,000 to 200,000 cps.

27. A method for attaching a semiconductor component to a substrate having a plurality of substrate contacts comprising:
    providing a plurality of terminal contacts on the component comprising a first solder alloy configured to melt at a temperature of from about 150° C. to 250° C.;
    providing a no flow underfill material comprising a polymer base material and a plurality of metal particles in the base material comprising a second solder alloy configured to melt at the temperature;
    depositing the underfill material on the substrate or on the component in a viscous state;
    placing the terminal contacts in contact with the substrate contacts while the underfill material is in the viscous state;
    heating the terminal contacts to the temperature to reflow the terminal contacts onto the substrate contacts to form connections therebetween comprising the first solder alloy and the second solder alloy; and
    melting the particles during the heating step to alloy at least some of the particles to at least some of the connections.

28. The method of claim 27 further comprising curing the underfill material following the heating step.

29. The method of claim 27 wherein the underfill material has a viscosity in the viscous state of from 7,000 to 200,000 cps.

30. The method of claim 27 wherein the depositing step is performed at a second temperature of from 22° C. to 100° C.

31. The method of claim 27 wherein the heating step is performed using a preheat stage, a reflow stage, and a curing stage.

32. The method of claim 27 wherein the particles have a diameter of from 1 μm to 10 μm.

33. A method for underfilling a semiconductor component having a plurality of terminal contacts on a substrate having a plurality of substrate contacts comprising:
    providing the terminal contacts of a material configured to melt at a temperature between about 150° C. to 250° C.;
    providing an underfill material comprising a polymer base material, a plurality of metal particles in the base material and a curing agent configured to cure the polymer base material;
    depositing the underfill material on the component or the substrate;
    placing the terminal contacts in contact with the substrate contacts while the underfill material is in a viscous condition; and
    heating the terminal contacts to the temperature to reflow the terminal contacts onto the substrate contacts and alloy at least some of the metal particles with the terminal contacts.

34. The method of claim 33 wherein the metal particles and the terminal contacts comprise a solder alloy.

35. The method of claim 33 wherein the viscous state comprises a semi cured condition.

* * * * *